(12) United States Patent
Sauciuc

(10) Patent No.: US 9,293,428 B2
(45) Date of Patent: Mar. 22, 2016

(54) LOW PROFILE HEAT SPREADER AND METHODS

(71) Applicant: Intel Corporation, Santa Clara, CA (US)

(72) Inventor: Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 430 days.

(21) Appl. No.: 13/706,986

(22) Filed: Dec. 6, 2012

(65) Prior Publication Data

US 2014/0160673 A1 Jun. 12, 2014

(51) Int. Cl.
*H01L 23/34* (2006.01)
*H01L 23/00* (2006.01)
*G06F 1/20* (2006.01)
*H01L 23/36* (2006.01)

(52) U.S. Cl.
CPC ............... *H01L 24/03* (2013.01); *G06F 1/203* (2013.01); *H01L 23/36* (2013.01); *H01L 24/29* (2013.01); *H01L 24/16* (2013.01); *H01L 24/32* (2013.01); *H01L 2224/16225* (2013.01); *H01L 2224/293* (2013.01); *H01L 2224/2929* (2013.01); *H01L 2224/29393* (2013.01); *H01L 2224/32225* (2013.01); *H01L 2224/32245* (2013.01); *H01L 2224/83424* (2013.01); *H01L 2224/83447* (2013.01); *H01L 2924/1517* (2013.01); *H01L 2924/15153* (2013.01); *H01L 2924/15159* (2013.01); *H01L 2924/15162* (2013.01); *H01L 2924/15724* (2013.01); *H01L 2924/15747* (2013.01)

(58) Field of Classification Search
None
See application file for complete search history.

(56) References Cited

U.S. PATENT DOCUMENTS

| | | | | |
|---|---|---|---|---|
| 6,496,373 | B1 * | 12/2002 | Chung | 361/705 |
| 6,681,482 | B1 * | 1/2004 | Lischner et al. | 29/840 |
| 7,030,485 | B2 * | 4/2006 | Houle et al. | 257/712 |
| 7,122,911 | B2 * | 10/2006 | Yang | H01L 23/3128 257/706 |
| 7,208,342 | B2 * | 4/2007 | Lee et al. | 438/106 |
| 7,220,485 | B2 * | 5/2007 | Sayir et al. | 428/408 |
| 7,750,466 | B2 * | 7/2010 | Rothman et al. | 257/737 |
| 2007/0282208 | A1 * | 12/2007 | Jacobs et al. | 600/485 |
| 2009/0294941 | A1 * | 12/2009 | Oh et al. | 257/686 |
| 2010/0321895 | A1 * | 12/2010 | Hill et al. | 361/715 |
| 2012/0218718 | A1 * | 8/2012 | Wertz | 361/718 |

* cited by examiner

*Primary Examiner* — Robert Carpenter
(74) *Attorney, Agent, or Firm* — Schwegman Lundberg & Woessner, P.A.

(57) ABSTRACT

Embodiments of semiconductor chip assemblies, and methods are shown that include adhesive thermal interface materials between a heat spreader and a semiconductor die. Assemblies and methods are shown where the heat spreader is not adhered to a substrate beneath the semiconductor die.

9 Claims, 6 Drawing Sheets

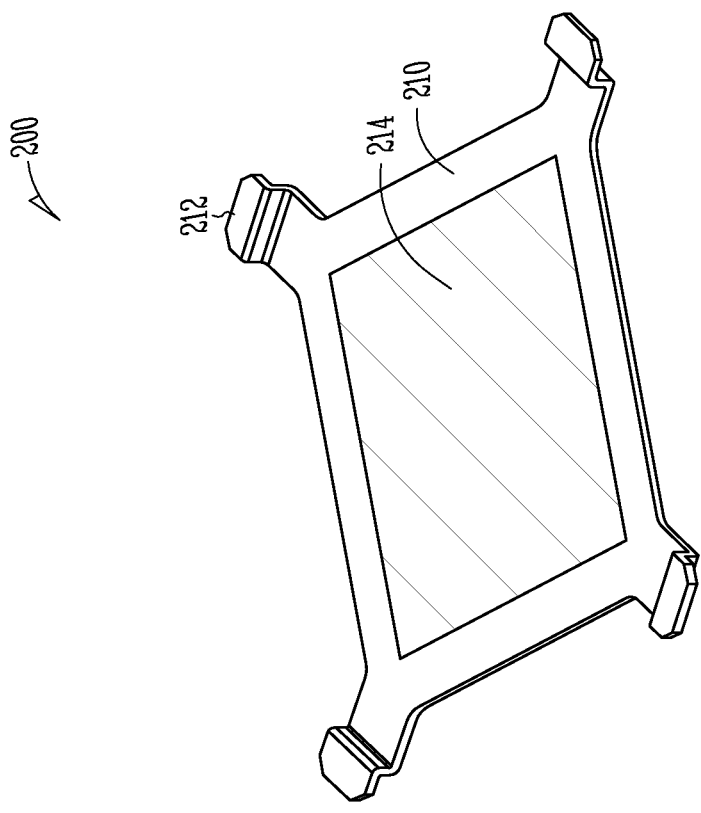
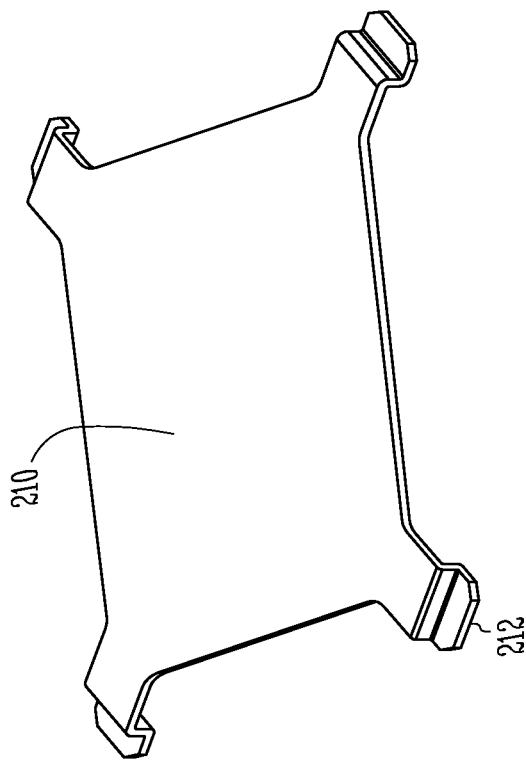
Fig. 2

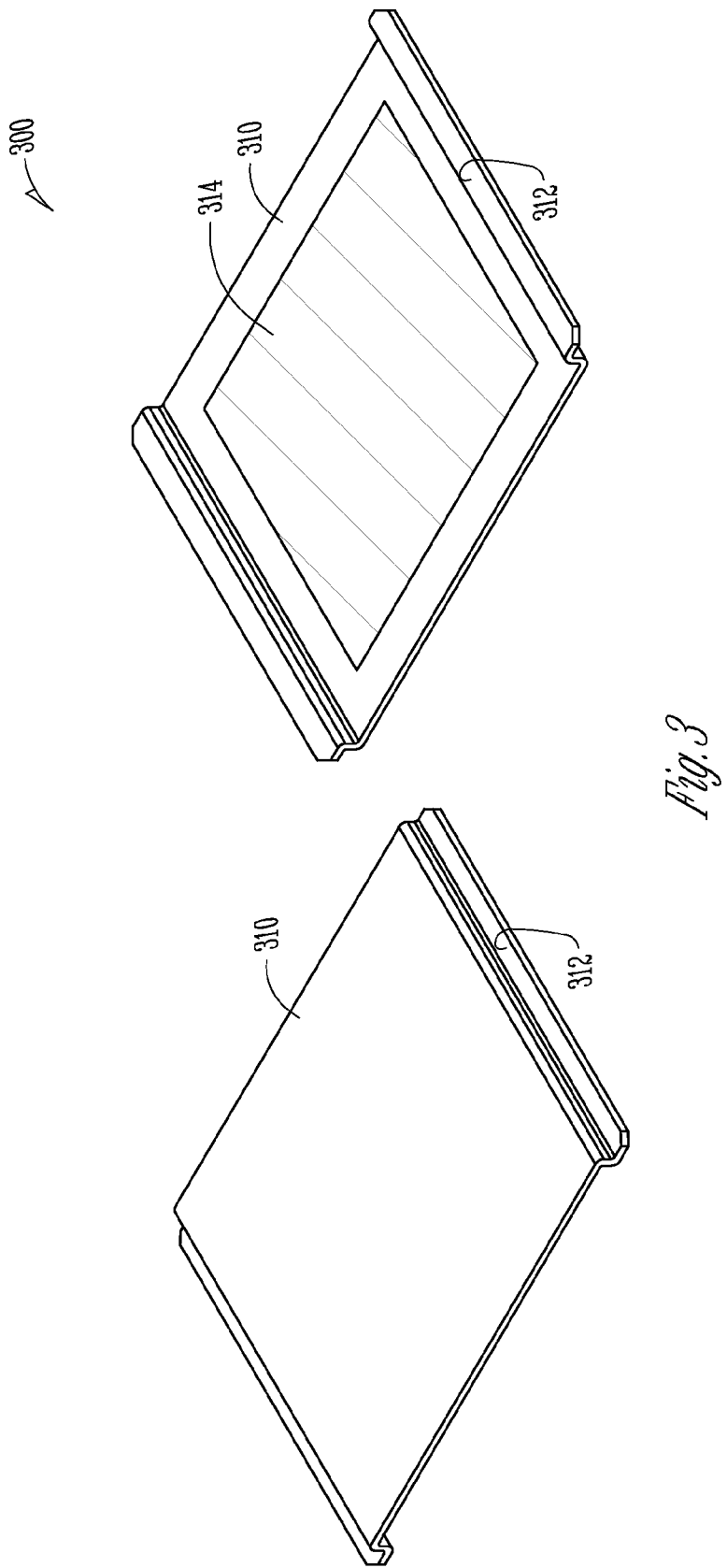

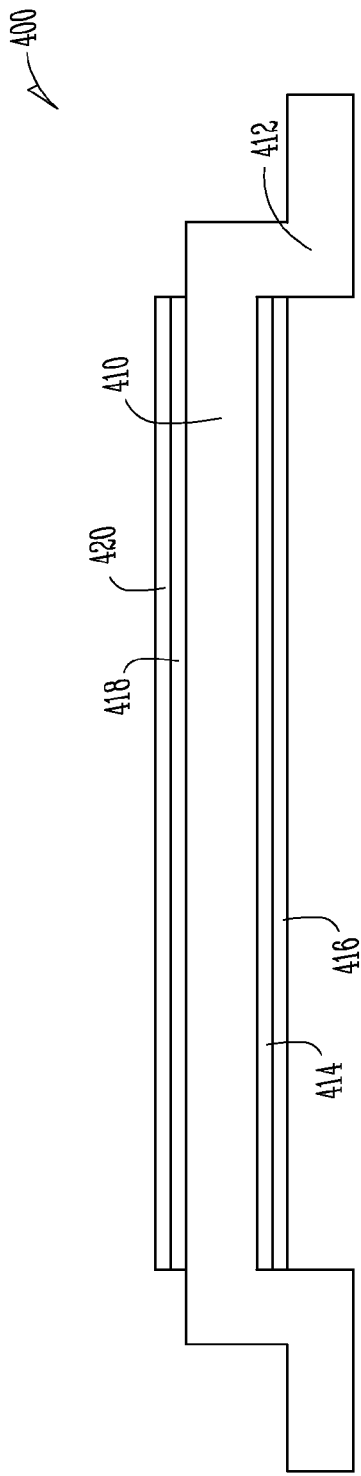
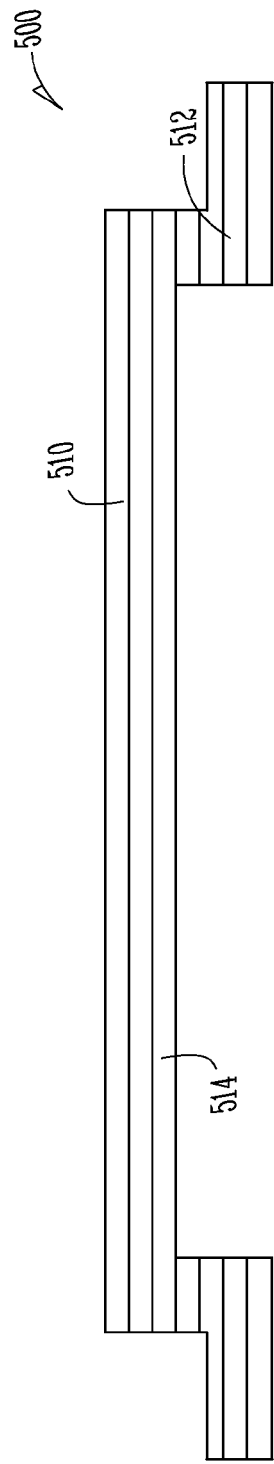

LOW PROFILE HEAT SPREADER AND METHODS

TECHNICAL FIELD

Embodiments pertain to integrated circuit (IC) dies and die packages, and associated methods.

BACKGROUND

Semiconductor chip assemblies must fit into increasingly smaller spaces as electronic device sizes become smaller. For example, in mobile phones or table computers, there is very little space to arrange components inside devices that may be less than one half an inch thick. Yet technical challenges such as heat dissipation must be dealt with in the confines of ever decreasing physical space. Additionally, pressure to reduce cost is ever present.

Configurations for semiconductor chip assemblies are desired that effectively utilize limited space within an electronic device, with acceptable or improved performance.

BRIEF DESCRIPTION OF THE DRAWINGS

FIG. 2 is an isometric view of a heat spreader in accordance with some embodiments;

FIG. 3 is an isometric view of another heat spreader in accordance with some embodiments;

FIG. 4 is a side view of another heat spreader in accordance with some embodiments;

FIG. 5 is a side view of another heat spreader in accordance with some embodiments;

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
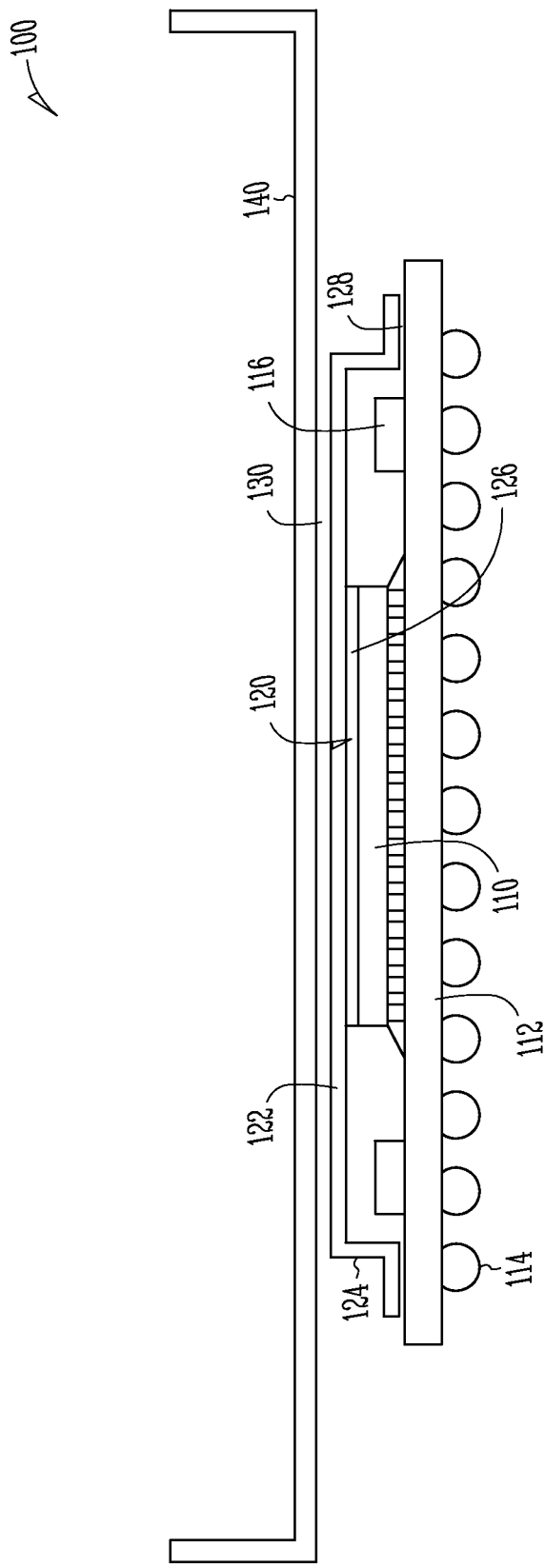
FIG. 1 is a side view of a semiconductor chip assembly in accordance with some embodiments.

FIG. 1 shows a semiconductor chip assembly 100 according to an embodiment of the invention. The assembly 100 includes a semiconductor die 110, attached to a substrate 112. In one example, the semiconductor die 110 includes a processor die. In one example, the semiconductor die 110 includes a system on a chip (SOC).

In the example shown, the substrate is a ball grid array (BGA) substrate, and includes a number of solder balls 114 for connection to additional circuitry, such as a board (not shown). Other example substrates may include other connection configurations, such as land grid array connections, etc. In one example, the substrate 112 includes one or more peripheral electronic devices 116. In one example the peripheral electronic devices 116 include one or more die side capacitors (DSCs).

A heat spreader 120 is shown located over the semiconductor die 110. The heat spreader 120 includes a planar portion 122 substantially covering the semiconductor die 110, and a number of structures 124 extending from the planar portion 122 and contacting the substrate 112.

An adhesive thermal interface material 126 is located between the heat spreader 120 and the semiconductor die 110. The adhesive thermal interface material 126 forms a heat conducting interface with both the semiconductor die 110 and the heat spreader 122.

In one example the adhesive thermal interface material 126 functions both as a thermal conduction pathway, and as a mechanical binder to hold the heat spreader 122 in place. In one example, because the thermal interface material 126 provides a mechanical binding function, no adhesives are necessary at an interface 128 between the heat spreader 120 and the substrate 112. One advantage of this configuration includes ease of assembly in placing the heat spreader 120 over the substrate 112. Another advantage includes a significantly decreased likelihood of accidental shorting or other damage to the peripheral electronic devices 116. Accidental shorting or other damage is reduced because of the absence of sealant, or other adhesive at the interface 128 that may damage the peripheral electronic devices 116.

One example of a thermal interface material 126 that functions both as a thermal conduction pathway, and as a mechanical binder includes a curable thermal interface material 126. In contrast to a thermal grease, a curable thermal interface material 126 hardens, and provides significant mechanical strength. Other examples of thermal interface materials 126 that function both as a thermal conduction pathway, and as a mechanical binder include pressure sensitive adhesives. In one example, the thermal interface material 126 includes conductive particulates mixed with an adhesive to enhance conductivity. Examples of conductive particulates include, but are not limited to graphite, carbon fiber, metallic particles, etc.

In selected examples where the number of structures 124 abut the substrate 112, but are not attached to the substrate 112, the number of structures 124 serve to control a space between the planar portion 122 of the heat spreader 120 and the substrate 112. By controlling this space, a desired amount of spreading of the thermal interface material 126 is controlled, without damage to the semiconductor die 110.

FIG. 2 shows an example of a heat spreader 200 that may be used in the location of heat spreader 120 from FIG. 1. The heat spreader 200 includes a planar portion 210, and a number of structures 212 extending from the planar portion 210. In one example, the heat spreader 200 is formed from copper or aluminum, for example by forging, stamping or drawing from a metal sheet. An adhesive thermal interface material, similar to adhesive thermal interface material similar 126 from FIG. 1, may be applied directly to the planar surface 210 of the heat spreader 200. In the example heat spreader 200 of FIG. 2, the number of structures 212 extending from the planar portion 210 include four corner legs. An adhesive region 214 is shown on an underside of the planar portion 210. In one example, the adhesive region 214 is covered by a protective film that can be peeled away during assembly to expose the adhesive thermal interface material. FIG. 4 illustrates this configuration in more detail below.

FIG. 3 shows an example of a heat spreader 300 that may be used in the location of heat spreader 120 from FIG. 1. The heat spreader 300 includes a planar portion 310, and a number of structures 312 extending from the planar portion 310. Similar to the heat spreader 200 of FIG. 2, the heat spreader 300 may be formed from a metal sheet. An adhesive thermal interface material, similar to adhesive thermal interface material similar 126 from FIG. 1, may be applied directly to the planar surface 310 of the heat spreader 300. In the example heat spreader 300 of FIG. 3, the number of structures 312 extending from the planar portion 310 include two long legs on opposite sides of the planar portion 310. An adhesive region 314 is shown on an underside of the planar portion 310.

FIG. 4 shows another example of a heat spreader 400 that may be used in the location of heat spreader 120 from FIG. 1. The heat spreader 400 includes a planar portion 410, and a number of structures 412 extending from the planar portion 410. The heat spreader 400 includes a first thermal interface material 414 covered by a first protective film 416. A second thermal interface material 418 is shown covered by a second protective film 420. In one example, the first thermal interface material 414, the second thermal interface material 418, or both thermal interface materials 414, 418 include adhesive thermal interface materials as described in examples above. In one example, the second thermal interface material 418 is positioned to contact a second heat spreader. In a tablet computer example a device chassis, such as an aluminum casing may serve as a second heat spreader.

FIG. 5 shows another example of a heat spreader 500 that may be used in the location of heat spreader 120 from FIG. 1. The heat spreader 500 includes a planar portion 510, and a number of structures 512 extending from the planar portion 510. In one example, the heat spreader 500 is a composite heat spreader, formed from multiple layers of different materials. In one example, graphite layers are sandwiched with polymer layers. Layered composite configurations may include higher thermal conductivity than metallic examples. In one example, layered composite configurations further provide improved compliance over metallic examples. A more compliant material may maintain thermal contact with a semiconductor die, even when the die and/or substrate are potentially flexed with handling of the electronic device, such as a tablet computer.

Figure 6:
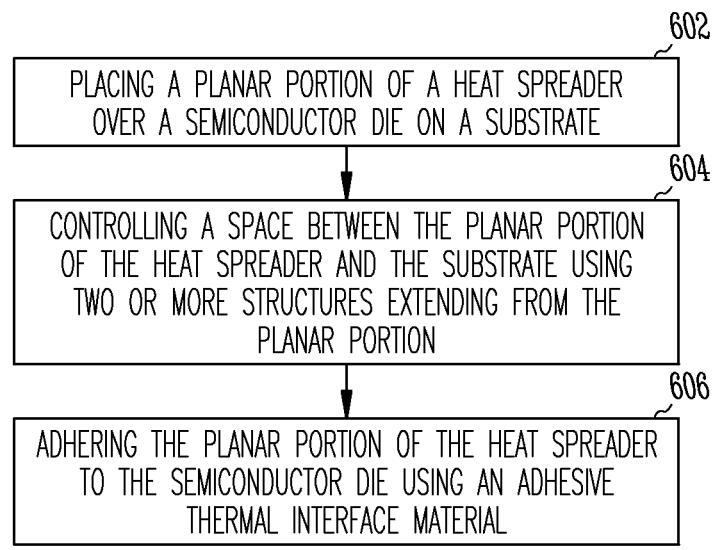
FIG. 6 is a flow diagram of an example method in accordance with some embodiments.

FIG. 6 shows an example method of assembling a semiconductor chip assembly according to an embodiment of the invention. In operation 602, a planar portion of a heat spreader is placed over a semiconductor die on a substrate. In operation 604, a space between the planar portion of the heat spreader and the substrate is controlled using two or more structures extending from the planar portion. In operation 606, the planar portion of the heat spreader is adhered to the semiconductor die using an adhesive thermal interface material.

Figure 7:
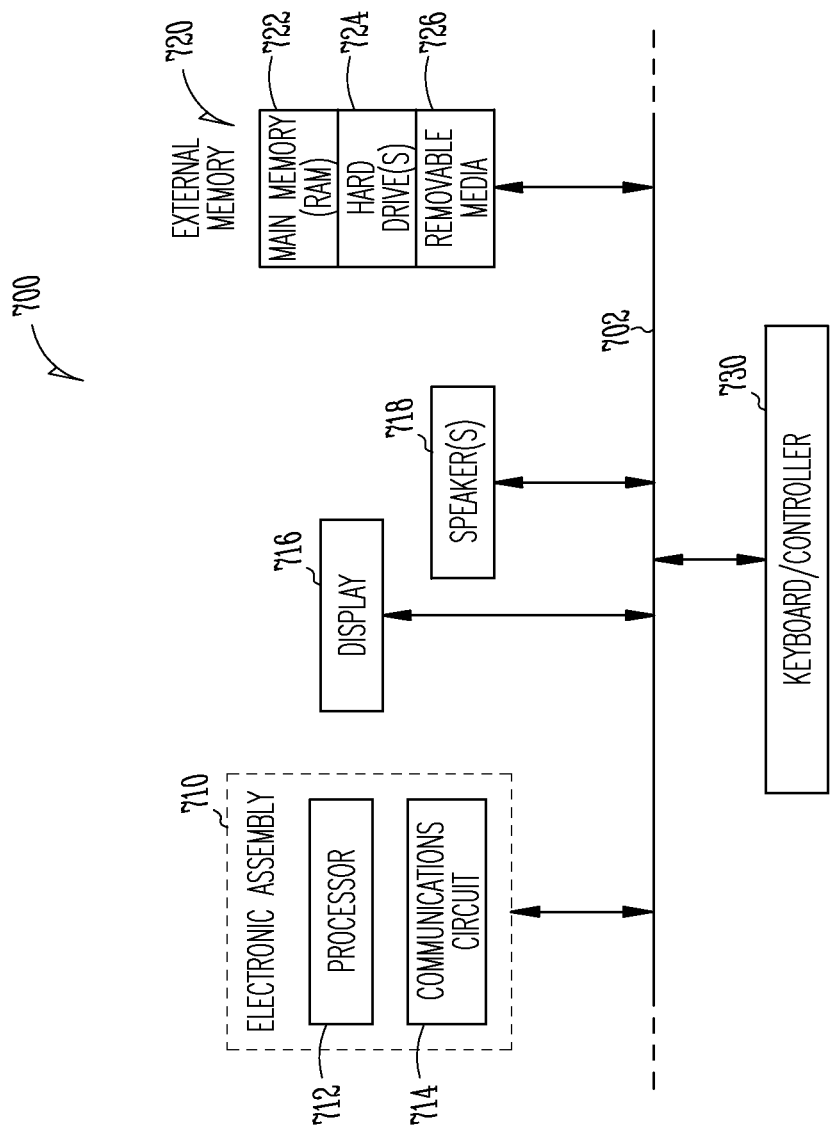
FIG. 7 is a block diagram of an electronic system in accordance with some embodiments.

An example of an electronic device using semiconductor chip assemblies and heat spreaders as described in the present disclosure is included to show an example of a higher level device application for the present invention. FIG. 7 is a block diagram of an electronic device 700 incorporating at least one pin and/or method in accordance with at least one embodiment of the invention. Electronic device 700 is merely one example of an electronic system in which embodiments of the present invention can be used. Examples of electronic devices 700 include, but are not limited to personal computers, tablet computers, mobile telephones, game devices, MP3 or other digital music players, etc. In this example, electronic device 700 comprises a data processing system that includes a system bus 702 to couple the various components of the system. System bus 702 provides communications links among the various components of the electronic device 700 and can be implemented as a single bus, as a combination of busses, or in any other suitable manner.

An electronic assembly 710 is coupled to system bus 702. The electronic assembly 710 can include any circuit or combination of circuits. In one embodiment, the electronic assembly 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 710 are a custom circuit, an application-specific integrated circuit (ASIC), or the like, such as, for example, one or more circuits (such as a communications circuit 714) for use in wireless devices like mobile telephones, personal data assistants, portable computers, two-way radios, and similar electronic systems. The IC can perform any other type of function.

The electronic device 700 can also include an external memory 720, which in turn can include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductor chip assembly, comprising:
   a semiconductor die attached to a substrate;
   a composite layered heat spreader located over the semiconductor chip, the heat spreader including graphite layers sandwiched with polymer layers and:
   a planar rectangular portion substantially covering the semiconductor die;
   four corner legs extending from the planar portion and contacting the substrate, each corner leg of the four corner legs extending diagonally away from respective sides forming each corner of the planar portion, each corner leg including a first portion generally perpendicular to the planar portion, connected to the planar portion, and a second portion generally parallel to the planar portion connected to the first portion so as to include a stepped profile;
   an adhesive thermal interface layer forming heat conducting interfaces with both the semiconductor die and the heat spreader.

2. The semiconductor chip assembly of claim 1, wherein the four corner legs extending from the planar portion abut the substrate, but are not attached to the substrate.

3. The semiconductor chip assembly of claim 1, wherein the adhesive thermal interface layer includes a cured matrix material.

4. The semiconductor chip assembly of claim 1, wherein the adhesive thermal interface layer includes a pressure sensitive adhesive.

5. The semiconductor chip assembly of claim 1, further including a second thermal interface material on a side of the heat spreader opposite the semiconductor die.

6. The semiconductor chip assembly of claim 1, wherein the semiconductor die includes a system on a chip (SOC).

7. The semiconductor chip assembly of claim 1, wherein the substrate includes one or more die side capacitors.

8. A tablet computer, comprising:
   a metallic chassis;
   a display screen coupled to the metallic chassis, with a space between the metallic chassis and the display screen containing a semiconductor chip assembly, including:
   a semiconductor die attached to a substrate;
   a heat spreader located over the semiconductor chip, the heat spreader including:
   a planar rectangular portion substantially covering the semiconductor die;
   four corner legs extending from the planar portion and contacting the substrate, each corner leg of the four corner legs extending diagonally away from respective sides forming each corner of the planar portion, each corner leg including a first portion generally perpendicular to the planar portion, connected to the planar portion, and a second portion generally parallel to the planar portion connected to the first portion so as to include a stepped profile;
   an adhesive thermal interface layer forming heat conducting interfaces with both the semiconductor die and the heat spreader; and
   a second thermal interface material forming heat conducting interfaces with both the heat spreader and the metallic chassis.

9. The tablet computer of claim 8, wherein the four corner legs extending from the planar portion abut the substrate, but are not attached to the substrate.

* * * * *